(12) United States Patent
Noda et al.

(10) Patent No.: US 10,221,497 B2
(45) Date of Patent: Mar. 5, 2019

(54) METHOD FOR MANUFACTURING WIRING BOARD WITH CONDUCTIVE POST

(71) Applicant: IBIDEN CO., LTD., Ogaki (JP)

(72) Inventors: Kota Noda, Ogaki (JP); Takema Adachi, Ogaki (JP); Wataru Nakamura, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 793 days.

(21) Appl. No.: 14/663,559

(22) Filed: Mar. 20, 2015

(65) Prior Publication Data

US 2015/0271929 A1   Sep. 24, 2015

(30) Foreign Application Priority Data

Mar. 20, 2014  (JP) ................... 2014-058234

(51) Int. Cl.
| | |
|---|---|
| *C25D 5/02* | (2006.01) |
| *C25D 7/12* | (2006.01) |
| *C25D 7/00* | (2006.01) |
| *C23C 18/16* | (2006.01) |
| *H05K 3/40* | (2006.01) |
| *C25D 5/10* | (2006.01) |
| *C25D 5/12* | (2006.01) |
| *C23C 18/38* | (2006.01) |
| *H05K 3/10* | (2006.01) |
| *H05K 3/24* | (2006.01) |
| *H05K 3/46* | (2006.01) |

(52) U.S. Cl.
CPC .......... *C25D 5/022* (2013.01); *C23C 18/1605* (2013.01); *C25D 7/00* (2013.01); *C25D 7/123* (2013.01); *H05K 3/4007* (2013.01); *C23C 18/1653* (2013.01); *C23C 18/38* (2013.01); *C25D 5/10* (2013.01); *C25D 5/12* (2013.01); *H05K 3/108* (2013.01); *H05K 3/244* (2013.01); *H05K 3/4644* (2013.01)

(58) Field of Classification Search
CPC .. C25D 5/02; C25D 7/123; C25D 7/00; C23C 18/38; H05K 3/108; H05K 3/244; H05K 3/4644
USPC ........................................................ 205/123
See application file for complete search history.

(56) References Cited

U.S. PATENT DOCUMENTS

| | | |
|---|---|---|
| 2012/0247823 A1 | 10/2012 | Kasai et al. |
| 2015/0092357 A1* | 4/2015 | Yoshikawa ............. H01L 25/00 361/746 |

* cited by examiner

*Primary Examiner* — Zulmariam Mendez
(74) *Attorney, Agent, or Firm* — Olbon, McClelland, Maier & Neustadt, L.L.P.

(57) ABSTRACT

A method for manufacturing a wiring board having conductive posts includes preparing a wiring board including electronic circuit and a solder resist layer covering the electronic circuit and having first openings and second openings surrounding the first openings such that the first openings are exposing pad portions of the electronic circuit and that the second openings are exposing post connecting portions of the electronic circuit surrounding the pad portions, applying surface treatment to the pad portions, forming a plating resist layer on the wiring board after the surface treatment of the pad portions such that the plating resist layer has resist openings exposing the post connecting portions, applying electrolytic plating on the post connecting portions such that conductive posts rising from the post connecting portions are formed in the resist openings, and removing the plating resist layer from the wiring board after forming the conductive posts in the resist openings.

20 Claims, 9 Drawing Sheets

METHOD FOR MANUFACTURING WIRING BOARD WITH CONDUCTIVE POST

CROSS-REFERENCE TO RELATED APPLICATIONS

The present application is based upon and claims the benefit of priority to Japanese Patent Application No. 2014-058234, filed Mar. 20, 2014, the entire contents of which are incorporated herein by reference.

BACKGROUND OF THE INVENTION

1. Field of the Invention

The present invention relates to a method for manufacturing a wiring board with conductive posts in which conductive posts are provided surrounding a group of pads.

2. Description of Background Art

As a wiring board used as a lower side package substrate of a PoP (package-on-package), solder balls for connecting with an upper side package substrate may be provided surrounding a group of pads. Further, in a wiring board with conductive posts, instead of the solder balls, conductive posts may be provided (for example, see U.S. Patent Application Publication No. 2012/0247823, FIG. 9A and 13). The entire contents of this publication are incorporated herein by reference.

SUMMARY OF THE INVENTION

According to one aspect of the present invention, a method for manufacturing a wiring board having conductive posts includes preparing a wiring board including an electronic circuit and a solder resist layer covering the electronic circuit and having first opening portions and second opening portions surrounding the first opening portions such that the first opening portions are exposing pad portions of the electronic circuit, respectively, and that the second opening portions are exposing post connecting portions of the electronic circuit surrounding the pad portions, respectively, applying a surface treatment to the pad portions, forming a plating resist layer on the wiring board after the surface treatment of the pad portions such that the plating resist layer has resist opening portions exposing the post connecting portions, respectively, applying electrolytic plating on the post connecting portions such that conductive posts rising from the post connecting portions are formed in the resist opening portions, and removing the plating resist layer from the wiring board after forming the conductive posts in the resist opening portions.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

Figure 1:
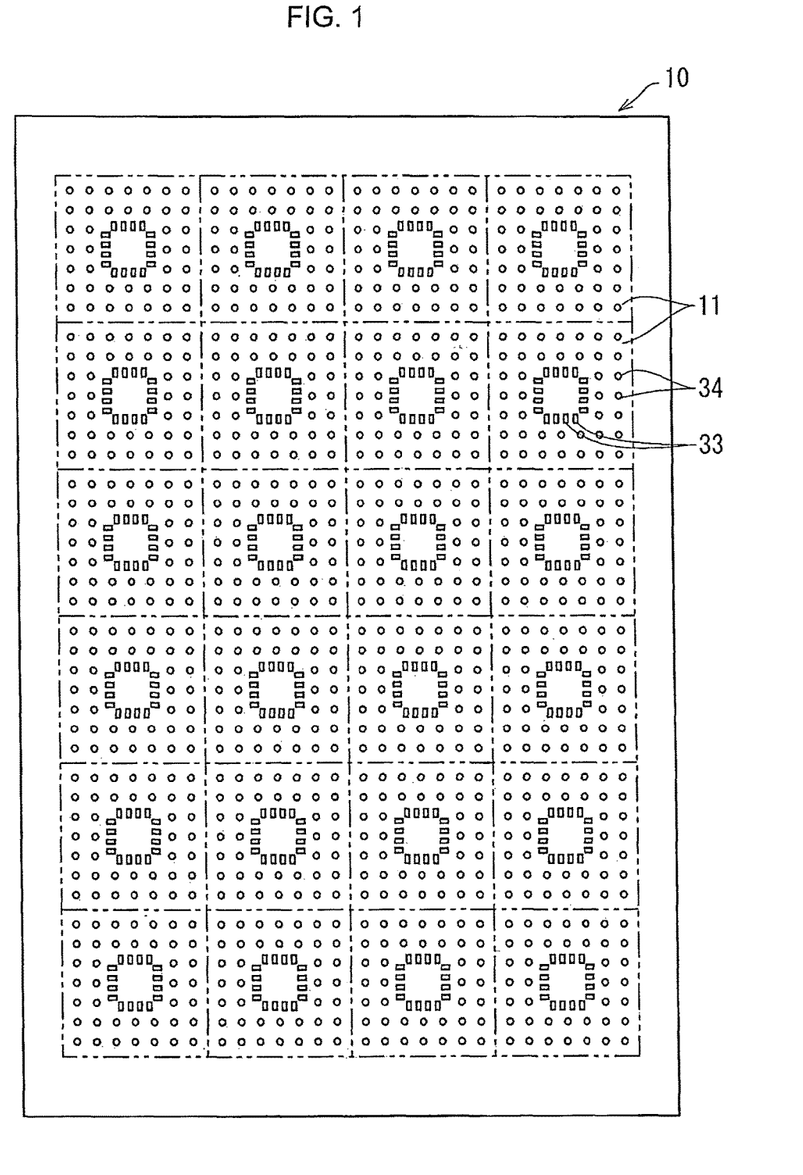
FIG. 1 illustrates a plan view of a wiring board according to an embodiment of the present invention.
Figure 2:
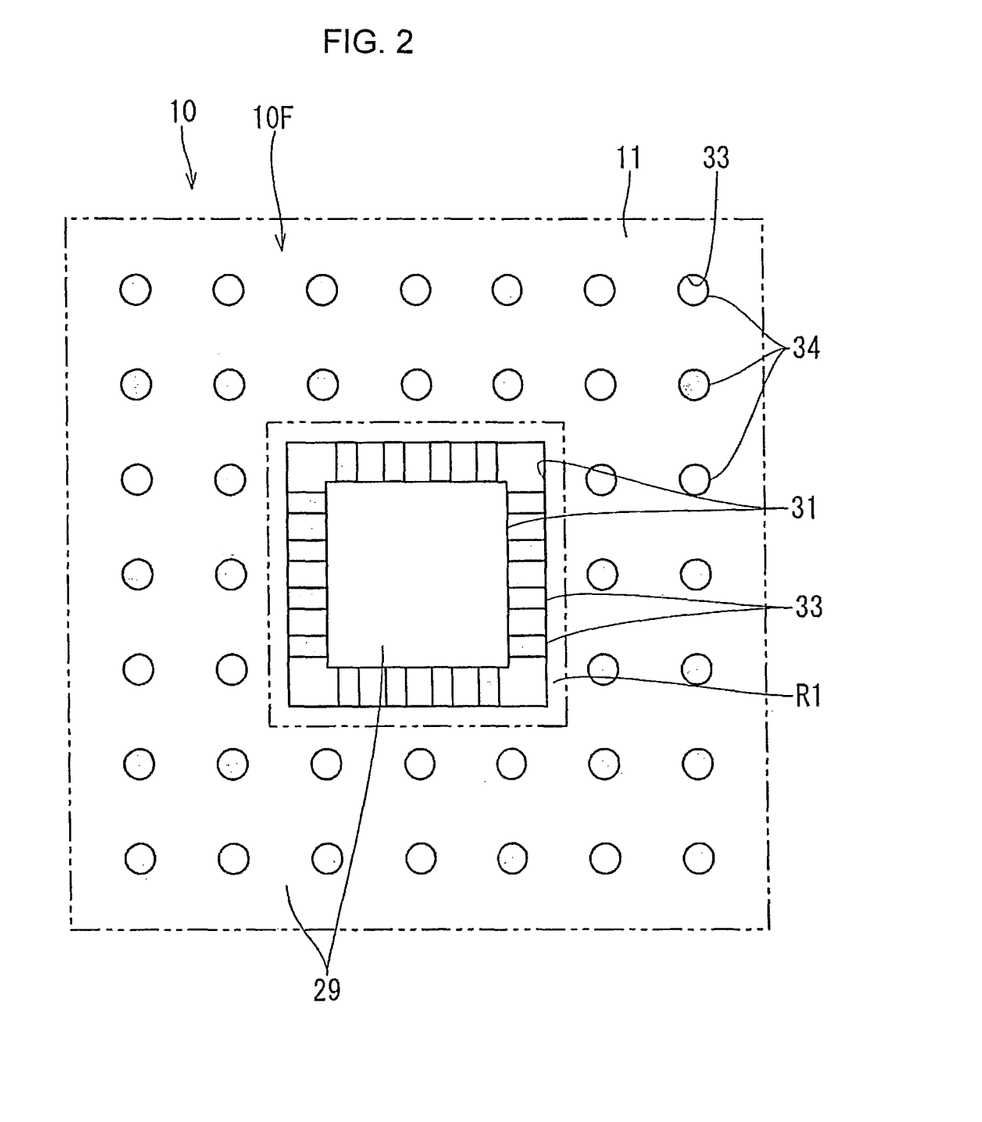
FIG. 2 illustrates a plan view of a segmented region of the wiring board.
Figure 3:
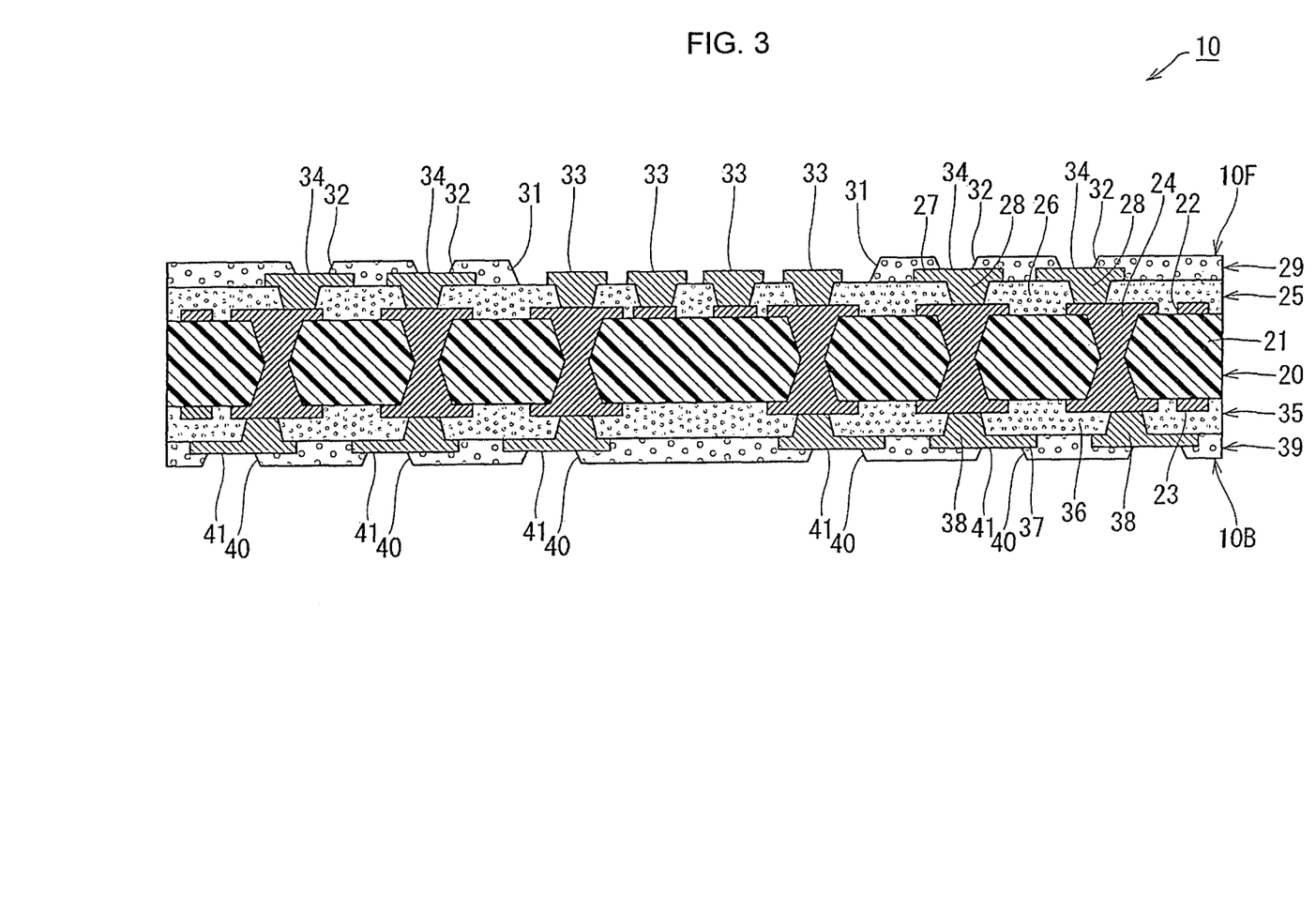
FIG. 3 illustrates a cross-sectional view of the wiring board.

In the following, an embodiment of the present invention is described based on FIG. 1-9. In the present embodiment, an example is illustrated in which the present invention is applied to a manufacturing method for manufacturing a wiring board 30 with conductive posts (see FIG. 9) from a wiring board 10 illustrated in FIG. 1. The wiring board 10 is partitioned, for example, into quadrangular segmented regions 11. A planar shape of one of the segmented regions 11 is illustrated in FIG. 2 and a cross-sectional shape of the segmented region 11 is illustrated in FIG. 3. As illustrated in FIG. 3, the wiring board 10 is formed to have a multilayer structure in which first and second build-up layers (25, 35) and the like are laminated on a core substrate 20.

The core substrate 20 has a structure in which a first core conductive layer 22 that is formed on one of front and back surfaces of an insulating substrate 21 and a second core conductive layer 23 that is formed the other surface of the insulating substrate 21 are connected by a through-hole conductor 24 that penetrates through the insulating substrate 21.

The first build-up layer 25 is formed on the core substrate 20 by an internal insulating layer 26 that is laminated on the first core conductive layer 22, a conductive layer 27 that is formed on the internal insulating layer 26, and a via conductor 28 that penetrates through the internal insulating layer 26 and conductively connects the conductive layer 27 to the through-hole conductor 24 of the core substrate 20 or to the first core conductive layer 22. Further, a solder resist layer 29 is laminated on the first build-up layer 25. Then, portions of the conductive layer 27 or the via conductor 28 are exposed to an F surface (10F), which is one of front and back surfaces of the wiring board 10, via first and second openings (31, 32) that are formed in the solder resist layer 29, and become pads 33 and post connecting parts 34 (to be described in detail later).

On the other hand, the second build-up layer 35 is formed on the core substrate 20 by an internal insulating layer 36 that is laminated on the second core conductive layer 23, a conductive layer 37 that is formed on the internal insulating layer 36, and a via conductor 38 that penetrates through the internal insulating layer 36 and conductively connects the conductive layer 37 to the through-hole conductor 24 of the core substrate 20 or to the second core conductive layer 23. Further, also on the second build-up layer 35, a solder resist layer 39 is laminated on the conductive layer 37, and portions of the conductive layer 37 or the via conductor 38 are exposed to a B surface (10B), which is the other one of the front and back surfaces of the wiring board 10, via third openings 40 that are formed in the solder resist layer 39, and become pads 41.

Details of the pads 33 and the post connecting parts 34 on the F surface (10F) of the wiring board 10 are as follows. The first openings 31 that are formed in the solder resist layer 29 each have, for example, as illustrated in FIG. 2, a groove shape surrounding an imaginary quadrangle, and the band-shaped pads 33 are positioned on a deep side of the opening. The band-shaped pads 33 are divided into four groups, and the four groups of the pads 33 are respectively arranged side by side on four sides of the imaginary quadrangle and each form a strip shape. On the other hand, the second openings 32 that are formed in the solder resist layer 29 are each formed in a tapered shape that is gradually reduced in diameter toward a deep side of the opening as illustrated in FIG. 3, and the post connecting parts 34 that are positioned on the deep sides of the openings each form a circular shape. As illustrated in FIG. 2, the post connecting parts 34 are arranged in a lattice-like form that surrounds a quadrangular region containing the pads 33, and the post connecting parts 34 on each side of the quadrangular region are arranged in two rows.

The wiring board 10 having the above-described structure can be manufactured, for example, by a manufacturing method described in Japanese Patent Laid-Open Publication No. 2014-22551. The entire contents of this publication are incorporated herein by reference. In the method for manufacturing the wiring board 30 with conductive posts of the present embodiment, the wiring board 30 with conductive posts is manufactured through the following (1)-(7) steps from the wiring board 10 that has been manufactured to have the above-described structure.

Figure 4:
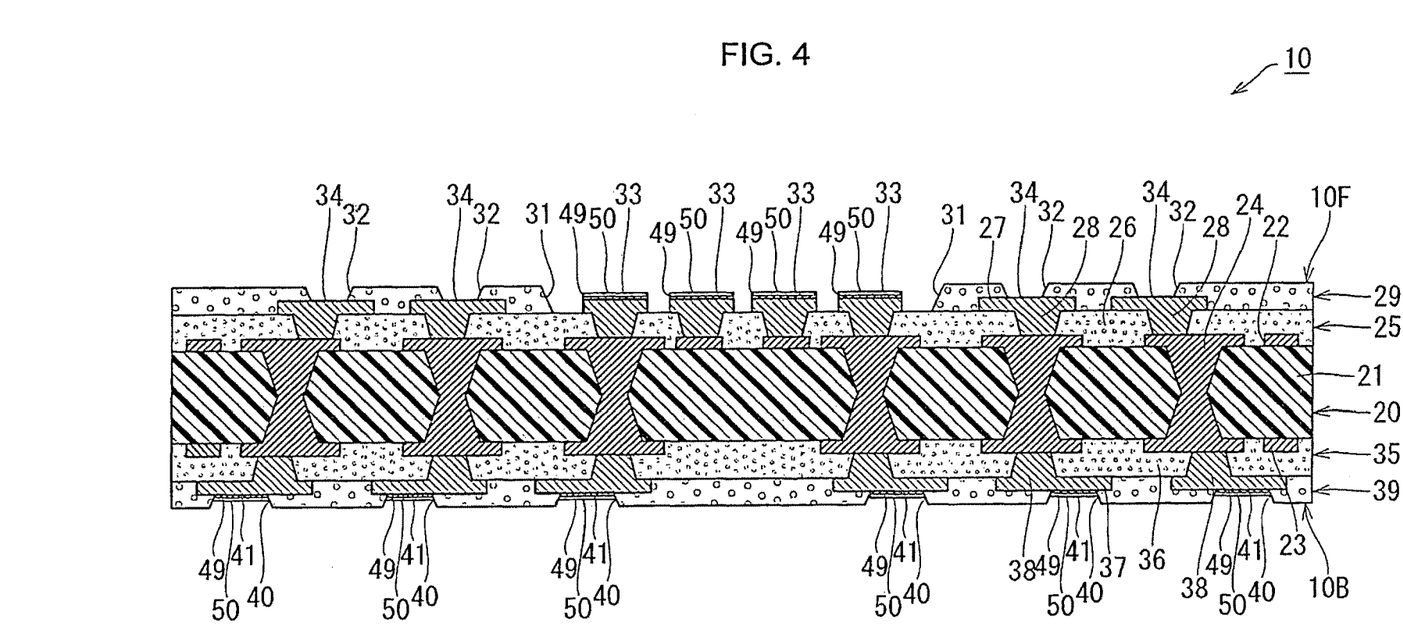
FIG. 4 illustrates a cross-sectional view of the wiring board on which pads have been subjected to surface treatment.

(1) As illustrated in FIG. 4, the pads (33, 41) on the F surface (10F) and the B surface (10B) of the wiring board 10 are subjected to a surface treatment. Specifically, for example, the F surface (10F) and the B surface (10B) are each entirely coated with a plating resist, and an opening part is formed in the plating resist on each of the pads (33, 41) to form thereon an oxidation prevention layer 49 by electrolytic plating. The oxidation prevention layer 49 is made of, for example, an alloy of nickel and gold, an alloy of nickel, palladium and gold, tin or the like. Next, a solder layer 50 is formed on the oxidation prevention layer 49 by electrolytic plating. The solder layer 50 is made of, for example, an alloy of tin and copper or silver, or an alloy of tin, copper and silver, or the like. Thereafter, the plating resist is removed. Although not illustrated in the drawings, it is preferable that, when the pads (33, 41) are subjected to the surface treatment, the second openings 32 are masked. Further, the formation of the oxidation prevention layer 49 may also be performed by immersion in water soluble preflux (OSP: Organic Solderability Preservative). In addition to the electrolytic plating, the formation of the solder layer 50 may also be performed by solder paste printing, using a solder ball mounting method, or the like.

Figure 5:
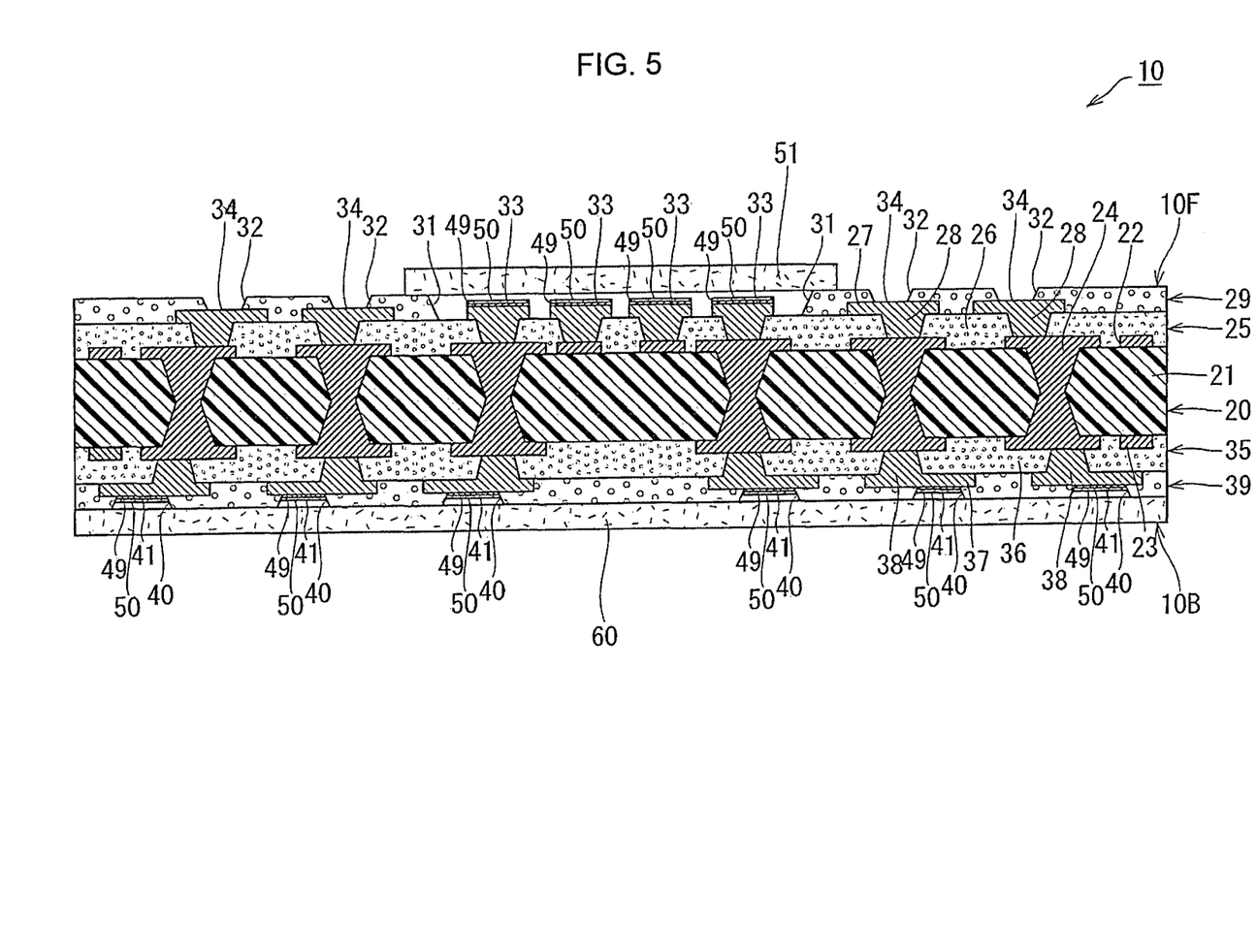
FIG. 5 illustrates a cross-sectional view of the wiring board in a state in which pad protection sheets have been laminated.

(2) Next, as illustrated in FIG. 5, the third openings 40 are closed by covering the entire B surface (10B) of the wiring board 10 with a pad protection sheet 60. The first openings 31 are closed by covering, with a pad protection sheet 51, an entire region (region (R1) surrounded by a two-dotted chain line in FIG. 2) that contains the pads 33 on an inner side of the post connecting parts 34 in each of the segmented regions 11 (see FIG. 2) on the F surface (10F) of the wiring board 10. As the pad protection sheets (51, 60), for example, dry films are used. The pad protection sheets (51, 60) are cured by being irradiated with ultraviolet light.

Figure 6:
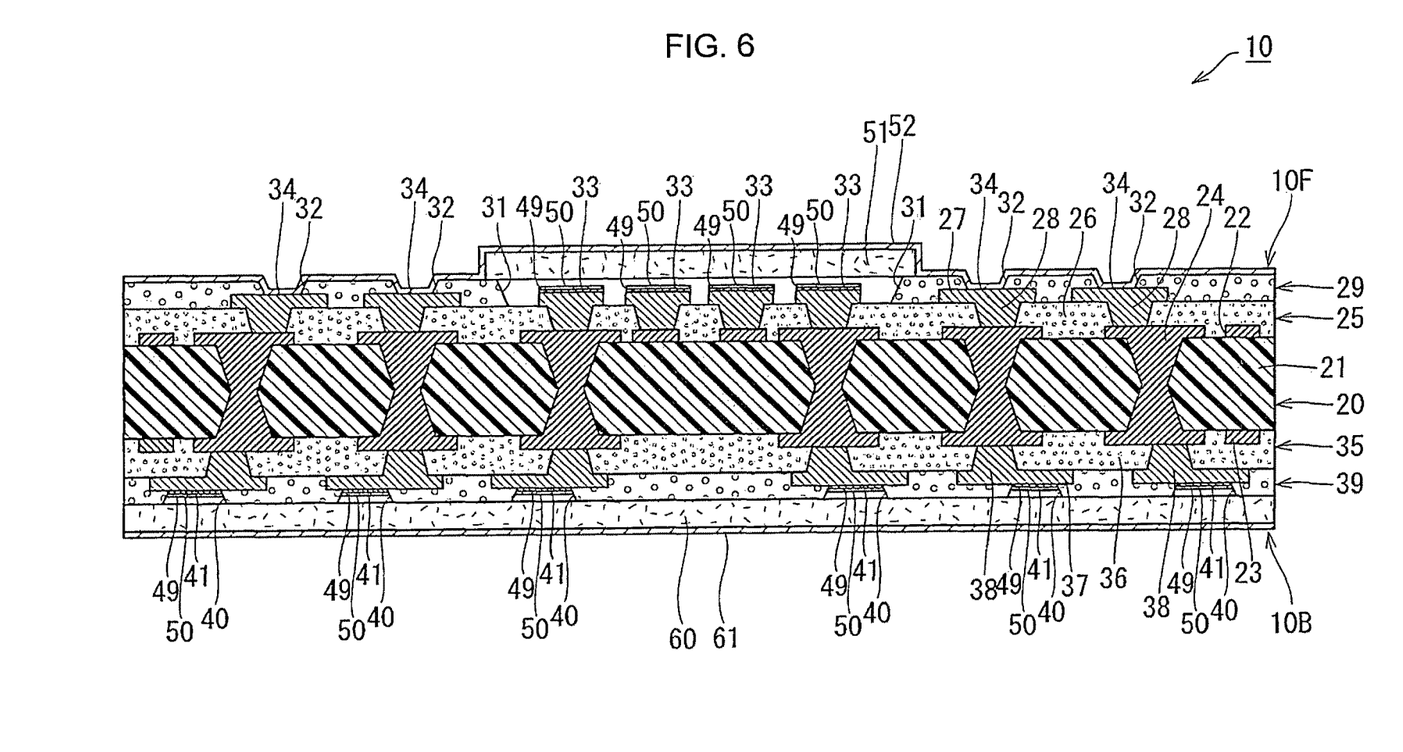
FIG. 6 illustrates a cross-sectional view of the wiring board in a state in which seed layers have been laminated.

(3) Next, as illustrated in FIG. 6, seed layers (52, 61) are formed by, for example, electroless copper plating on the pad protection sheets (51, 60) on the F surface (10F) and the B surface (10B) of the wiring board 10.

Figure 7:
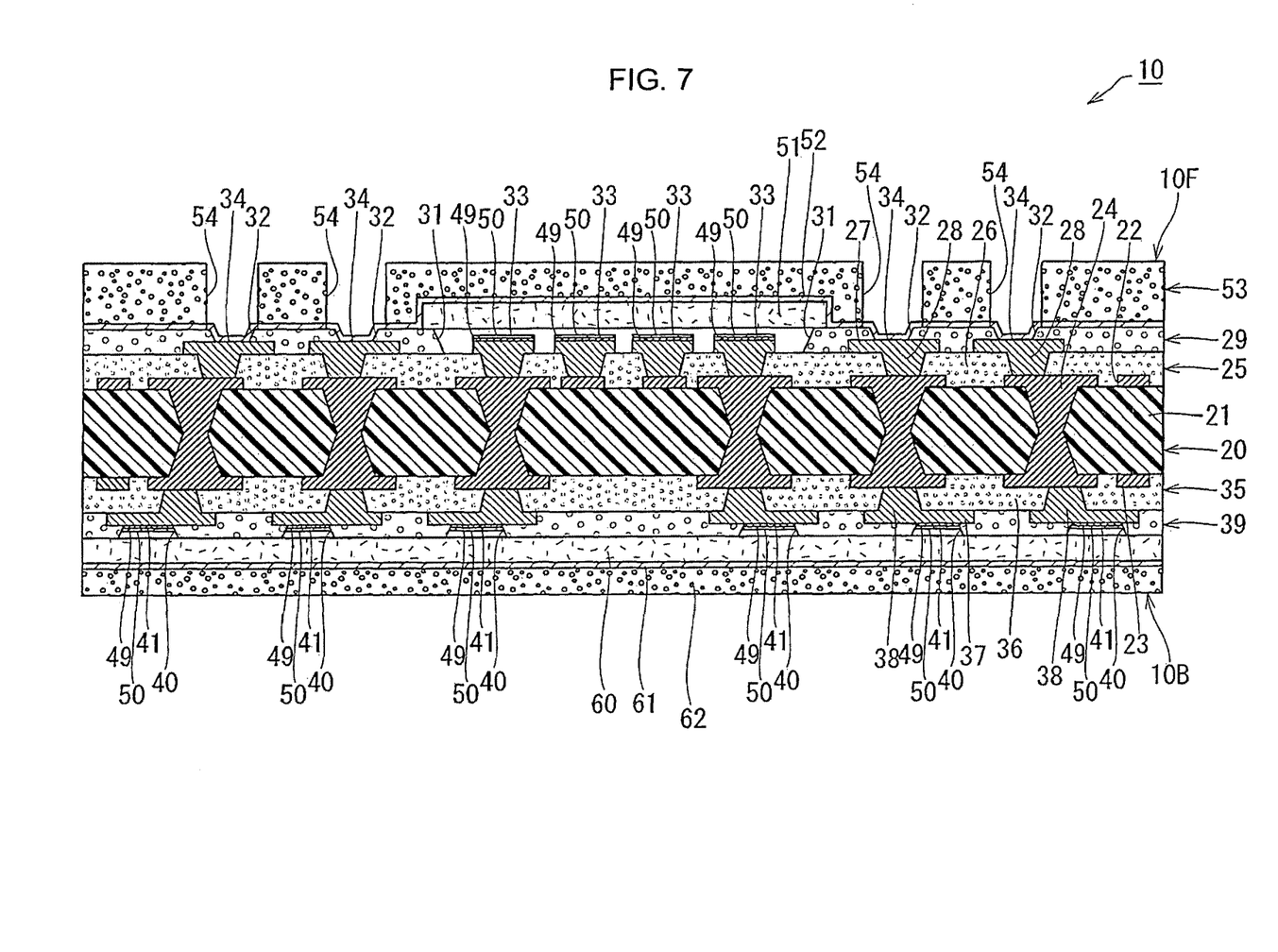
FIG. 7 illustrates a cross-sectional view of the wiring board in a state in which plating resist layers have been laminated.

(4) Next, as illustrated in FIG. 7, a plating resist layer 53 is laminated on the seed layer 52 on the F surface (10F) of the wiring board 10, and a plating resist layer 62 is laminated on the seed layer 61 of the B surface (10B). As the plating resist layers 53, 62, for example, dry films thicker than the pad protection sheet (51, 60) are used. Then, the plating resist layer 53, excluding portions on the post connecting parts 34, are irradiated with ultraviolet light to be cured. Thereafter, the plating resist layer 53 on the post connecting parts 34 is removed using an alkaline aqueous solution (for example, a potassium hydroxide aqueous solution of 1%) to form resist openings 54. In this case, the resist opening 54 forms a concentric circular shape slightly larger than the second opening 32.

Figure 8:
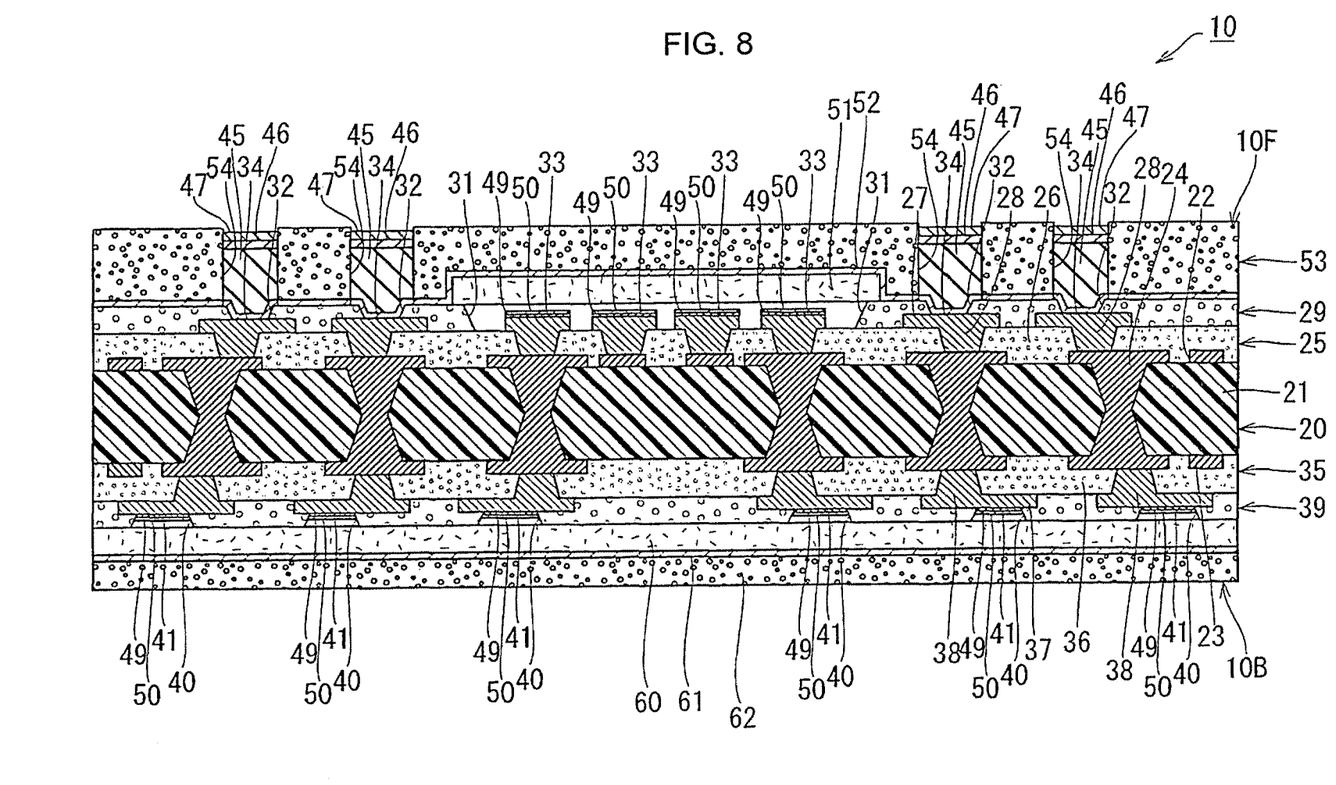
FIG. 8 illustrates a cross-sectional view of the wiring board in a state in which conductive posts have been formed.

(5) Next, as illustrated in FIG. 8, by an electrolytic plating treatment, the resist openings 54 are filled by plating to form conductive posts 45 on the post connecting parts 34. In this case, the conductive posts 45 are formed to each have a height in a range of 30 μm-130 μm.

(6) Front end surfaces of the conductive posts 45 are subjected to a surface treatment. Specifically, for example, first, an oxidation prevention layer 46 is formed by electrolytic plating. The oxidation prevention layer 46 is made of, for example, an alloy of nickel and gold, an alloy of nickel, palladium and gold, tin or the like. Next, a solder layer 47 is formed on the oxidation prevention layer 46 by electrolytic plating. The solder layer 47 is made of, for example, an alloy of tin and copper or silver, or an alloy of tin, copper and silver, or the like. The formation of the oxidation prevention layer 46 may also be performed by immersion in a water soluble preflux.

Figure 9:
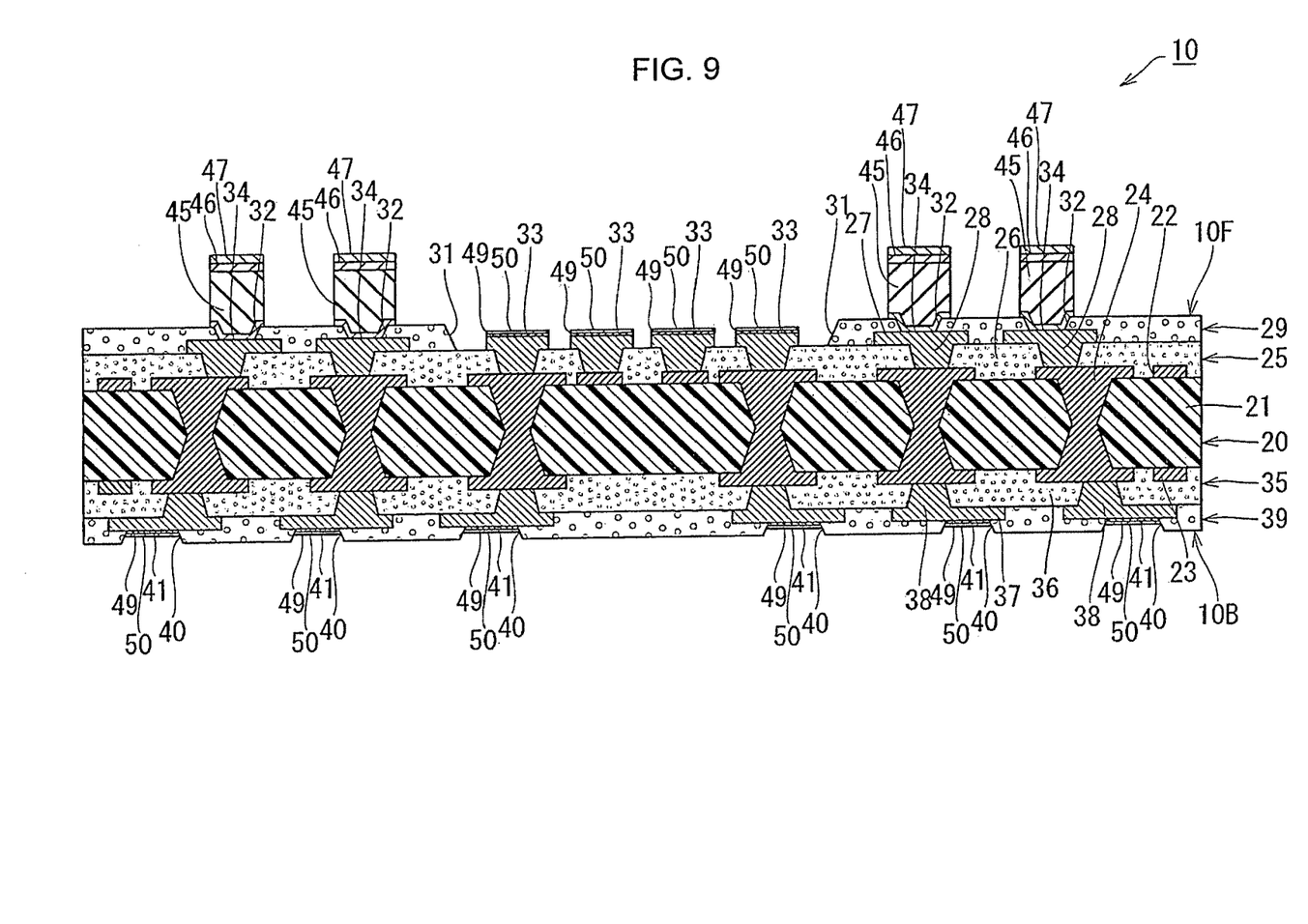
FIG. 9 illustrates a cross-sectional view of a wiring board with conductive posts.

(7) Next, the plating resist layer 53 is removed using an alkaline aqueous solution of a concentration higher than when the resist opening 54 is formed (for example, a potassium hydroxide aqueous solution of 5%). The seed layer 52 is removed using an acidic aqueous solution (for example, a cupric chloride aqueous solution of 5%). Further, the pad protection sheets 51, 60 are removed using an alkaline aqueous solution (for example, a potassium hydroxide aqueous solution of 5%). Thus, the wiring board 30 with conductive posts is manufactured from the wiring board 10.

As described above, in the method for manufacturing wiring board 30 with the conductive posts of the present embodiment, the pads 33 are subjected to a surface treatment and to a coating treatment using the pad protection sheet 51 before the formation of the conductive posts 45 that surround the pads 33. Therefore, these treatments can be efficiently performed without being interfered by the conductive posts 45. As a result, productivity of the manufacture of the wiring board 30 with the conductive posts is improved. Further, due to the pad protection sheet 51, that the seed layer 52 is laminated between the pads 33 is prevented. Therefore, the wiring board 30 with the conductive posts can be easily made to have a fine wiring pattern. Further, as a result, the productivity of the wiring board 30 with the conductive posts for a peripheral-type semiconductor chip having the band-shaped pads 33 for which productivity is conventionally low can be improved. Further, in the method for manufacturing the wiring board 30 with the conductive posts of the present embodiment, the front end surfaces of the conductive posts 45 are subjected to the surface treatment before the removal of the plating resist layer 53. Therefore, the plating resist layer 53 also serves as a resist for the surface treatment. The productivity is improved also in this respect.

Other Embodiments

The present invention is not limited to the above-described embodiment. For example, an embodiment described below is also included in the technical scope of the present invention. Further, in addition to the embodiment described below, the present invention can also be embodied in various modified forms within the scope without departing from the spirit of the present invention.

(1) In the above-described embodiment, an example is described in which the seed layer 52 is laminated below the plating resist layer 53 to form the conductive posts 45. However, it is also possible that the conductive posts 45 are formed without providing the seed layer 52.

Along with progresses in miniaturization of a wiring board and in making a wiring board with a fine wiring pattern, when performing processing in a region containing a group of pads during a manufacturing process of a wiring board with conductive posts, conductive posts surrounding the region may become obstacles and thus productivity may be lowered.

A method for manufacturing a wiring board with conductive posts according to an embodiment of the present invention provides higher productivity.

A method for manufacturing a wiring board with conductive posts according to an embodiment of the present invention includes: preparing a wiring board that has an internal electronic circuit, has an outer surface covered by a solder resist layer, has pads as portions of the electronic circuit exposed in first openings of the solder resist layer, and has post connecting parts as portions of the electronic circuit exposed from second openings of the solder resist layer, the post connecting parts surrounding the pads; subjecting the pads to a surface treatment; after the surface treatment of the pads, coating the wiring board with a plating resist layer and forming resist openings in the plating resist layer to expose the post connecting parts; forming the conductive posts in the resist openings by electrolytic plating, the conductive posts rising from the post connecting parts; and after the formation of the conductive posts, removing the plating resist layer.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a wiring board having conductive posts, comprising:
    preparing a wiring board comprising an electronic circuit and a solder resist layer covering the electronic circuit and having a plurality of first opening portions and a plurality of second opening portions surrounding the plurality of first opening portions such that the plurality of first opening portions is exposing a plurality of pad portions of the electronic circuit, respectively, and that the plurality of second opening portions is exposing a plurality of post connecting portions of the electronic circuit surrounding the pad portions, respectively;
    applying a surface treatment to the plurality of pad portions;
    forming a plating resist layer on the wiring board after the surface treatment of the pad portions such that the plating resist layer has a plurality of resist opening portions exposing the plurality of post connecting portions, respectively;
    applying electrolytic plating on the plurality of post connecting portions such that a plurality of conductive posts rising from the plurality of post connecting portions is formed in the plurality of resist opening portions, respectively; and
    removing the plating resist layer from the wiring board after forming the plurality of conductive posts in the plurality of resist opening portions.

2. A method for manufacturing a wiring board having conductive posts according to claim 1, wherein the applying of a surface treatment includes forming an oxidation prevention film on each of the pad portions.

3. A method for manufacturing a wiring board having conductive posts according to claim 1, wherein the applying of a surface treatment includes forming an oxidation prevention film on each of the pad portions and forming a solder layer on the oxidation prevention film.

4. A method for manufacturing a wiring board having conductive posts according to claim 3, wherein the solder layer is formed on the oxidation prevention film by one of a printing process, a ball loading process, and an electrolytic plating process.

5. A method for manufacturing a wiring board having conductive posts according to claim 1, further comprising:
    forming a pad protection sheet on the solder resist layer prior to the forming of a plating resist layer such that the pad protection sheet covers a portion of the solder resist layer including the plurality of pad portion and surrounded by the plurality of post connecting portions; and
    removing the pad protection sheet from the wiring board after the plurality of post connecting portions is formed,
    wherein the forming of a plating resist layer comprises forming the plating resist layer on the wiring board such that the plating resist layer covers the pad protection sheet.

6. A method for manufacturing a wiring board having conductive posts according to claim 2, further comprising:
    forming a pad protection sheet on the solder resist layer prior to the forming of a plating resist layer such that the pad protection sheet covers a portion of the solder resist layer including the plurality of pad portion and surrounded by the plurality of post connecting portions; and
    removing the pad protection sheet from the wiring board after the plurality of post connecting portions is formed,
    wherein the forming of a plating resist layer comprises forming the plating resist layer on the wiring board such that the plating resist layer covers the pad protection sheet.

7. A method for manufacturing a wiring board having conductive posts according to claim 3, further comprising:
    forming a pad protection sheet on the solder resist layer prior to the forming of a plating resist layer such that the pad protection sheet covers a portion of the solder resist layer including the plurality of pad portion and surrounded by the plurality of post connecting portions; and removing the pad protection sheet from the wiring board after the plurality of post connecting portions is formed, wherein the forming of a plating resist layer comprises forming the plating resist layer on the wiring board such that the plating resist layer covers the pad protection sheet.

8. A method for manufacturing a wiring board having conductive posts according to claim 4, further comprising:

forming a pad protection sheet on the solder resist layer prior to the forming of a plating resist layer such that the pad protection sheet covers a portion of the solder resist layer including the plurality of pad portion and surrounded by the plurality of post connecting portions; and removing the pad protection sheet from the wiring board after the plurality of post connecting portions is formed, wherein the forming of a plating resist layer comprises forming the plating resist layer on the wiring board such that the plating resist layer covers the pad protection sheet.

9. A method for manufacturing a wiring board having conductive posts according to claim 5, further comprising:

forming a seed layer over the pad protection sheet such that the seed layer is formed on the plurality of post connection portions prior to the applying of electrolytic plating; and removing the seed layer form the wiring board after the plurality of post connecting portions is formed.

10. A method for manufacturing a wiring board having conductive posts according to claim 1, further comprising:

applying a surface treatment on an end surface of each of the posts prior to the removing of the plating resist layer.

11. A method for manufacturing a wiring board having conductive posts according to claim 2, further comprising:

applying a surface treatment on an end surface of each of the posts prior to the removing of the plating resist layer.

12. A method for manufacturing a wiring board having conductive posts according to claim 3, further comprising:

applying a surface treatment on an end surface of each of the posts prior to the removing of the plating resist layer.

13. A method for manufacturing a wiring board having conductive posts according to claim 4, further comprising:

applying a surface treatment on an end surface of each of the posts prior to the removing of the plating resist layer.

14. A method for manufacturing a wiring board having conductive posts according to claim 5, further comprising:

applying a surface treatment on an end surface of each of the posts prior to the removing of the plating resist layer.

15. A method for manufacturing a wiring board having conductive posts according to claim 6, further comprising:

applying a surface treatment on an end surface of each of the posts prior to the removing of the plating resist layer.

16. A method for manufacturing a wiring board having conductive posts according to claim 7, wherein the applying of a surface treatment on an end surface of each of the posts includes forming an oxidation prevention film on the end surface of each of the posts.

17. A method for manufacturing a wiring board having conductive posts according to claim 10, wherein the applying of a surface treatment on an end surface of each of the posts includes forming an oxidation prevention film on the end surface of each of the posts and forming a solder layer on the oxidation prevention film.

18. A method for manufacturing a wiring board having conductive posts according to claim 17, wherein the solder layer is formed on the oxidation prevention film by an electrolytic plating process.

19. A method for manufacturing a wiring board having conductive posts according to claim 1, wherein the plurality of pad portions includes a plurality of pad groups each having band-shaped pad portions aligned side by side.

20. A method for manufacturing a wiring board having conductive posts according to claim 2, wherein the plurality of pad portions includes a plurality of pad groups each having band-shaped pad portions aligned side by side.

* * * * *